United States Patent
Varghese

(10) Patent No.: US 10,903,082 B2
(45) Date of Patent: Jan. 26, 2021

(54) SPACER SCULPTING FOR FORMING SEMICONDUCTOR DEVICES

(71) Applicant: Varian Semiconductor Equipment Associates, Inc., Gloucester, MA (US)

(72) Inventor: Sony Varghese, Manchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 16/251,856

(22) Filed: Jan. 18, 2019

(65) Prior Publication Data

US 2020/0098579 A1    Mar. 26, 2020

Related U.S. Application Data

(60) Provisional application No. 62/734,590, filed on Sep. 21, 2018.

(51) Int. Cl.
| | |
|---|---|
| *H01L 21/308* | (2006.01) |
| *H01L 21/3065* | (2006.01) |
| *H01L 21/033* | (2006.01) |
| *H01L 27/108* | (2006.01) |

(52) U.S. Cl.
CPC ...... *H01L 21/3086* (2013.01); *H01L 21/0337* (2013.01); *H01L 21/3065* (2013.01); *H01L 27/10844* (2013.01)

(58) Field of Classification Search
None
See application file for complete search history.

(56) References Cited

U.S. PATENT DOCUMENTS

| | | | | |
|---|---|---|---|---|
| 9,786,545 | B1* | 10/2017 | Bouche | H01L 21/76877 |
| 2009/0319970 | A1* | 12/2009 | Park | G06F 30/398 |
| | | | | 716/106 |
| 2010/0130016 | A1* | 5/2010 | DeVilliers | H01L 21/76816 |
| | | | | 438/703 |
| 2014/0131830 | A1* | 5/2014 | Shepard | H01L 45/1683 |
| | | | | 257/499 |
| 2016/0379816 | A1* | 12/2016 | Ruffell | H01L 21/3086 |
| | | | | 438/712 |
| 2017/0221902 | A1* | 8/2017 | Kang | H01L 21/823431 |
| 2019/0139964 | A1* | 5/2019 | Varghese | H01L 21/3086 |
| 2019/0348287 | A1* | 11/2019 | Varghese | H01L 21/68764 |

* cited by examiner

*Primary Examiner* — Zandra V Smith
*Assistant Examiner* — Lawrence C Tynes, Jr.
(74) *Attorney, Agent, or Firm* — Kacvinsky Daisak Bluni PLLC

(57) ABSTRACT

A method may include forming in a substrate a first array of a first material of first linear structures, interspersed with a second array of a second material, of second linear structures, the first and second linear structures elongated along a first axis. The method may include generating a chop pattern in the first layer, comprising a third linear array, interspersed with a fourth linear array. The third and fourth linear arrays may be elongated along a second axis, forming a non-zero angle of incidence with respect to the first axis. The third linear array may include alternating portions of the first and second material, while the fourth linear array comprises an array of cavities, arranged within the patterning layer. The method may include elongating a first set of cavities along the first axis, to form a first set of elongated cavities bounded by the first material.

10 Claims, 7 Drawing Sheets

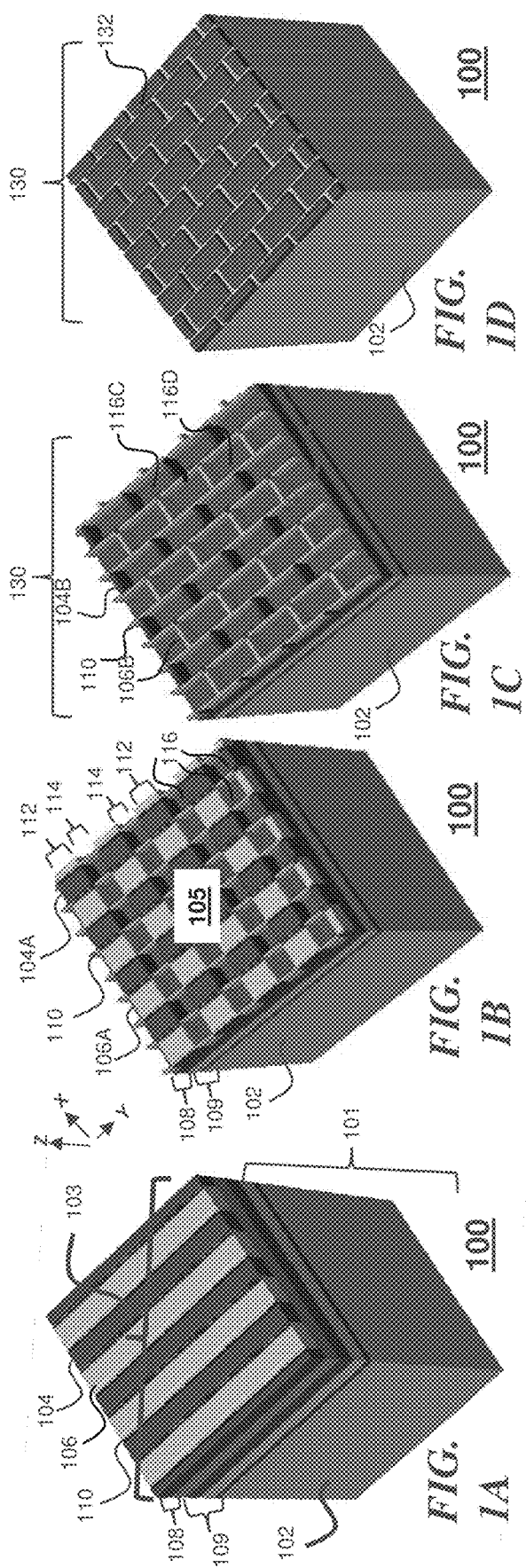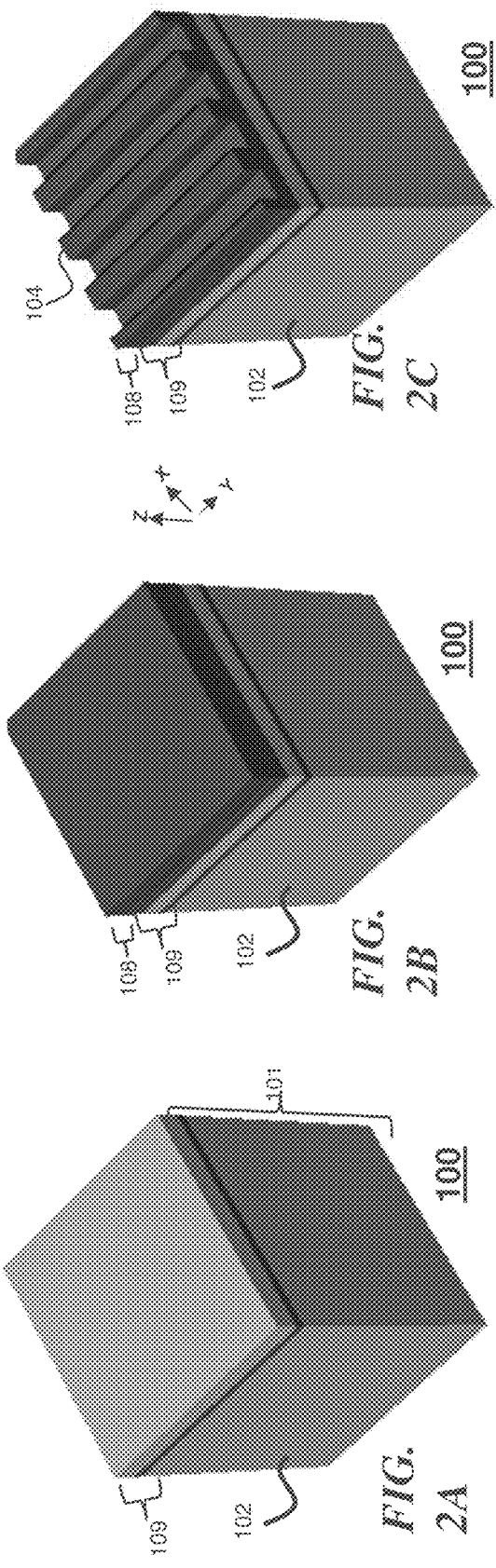

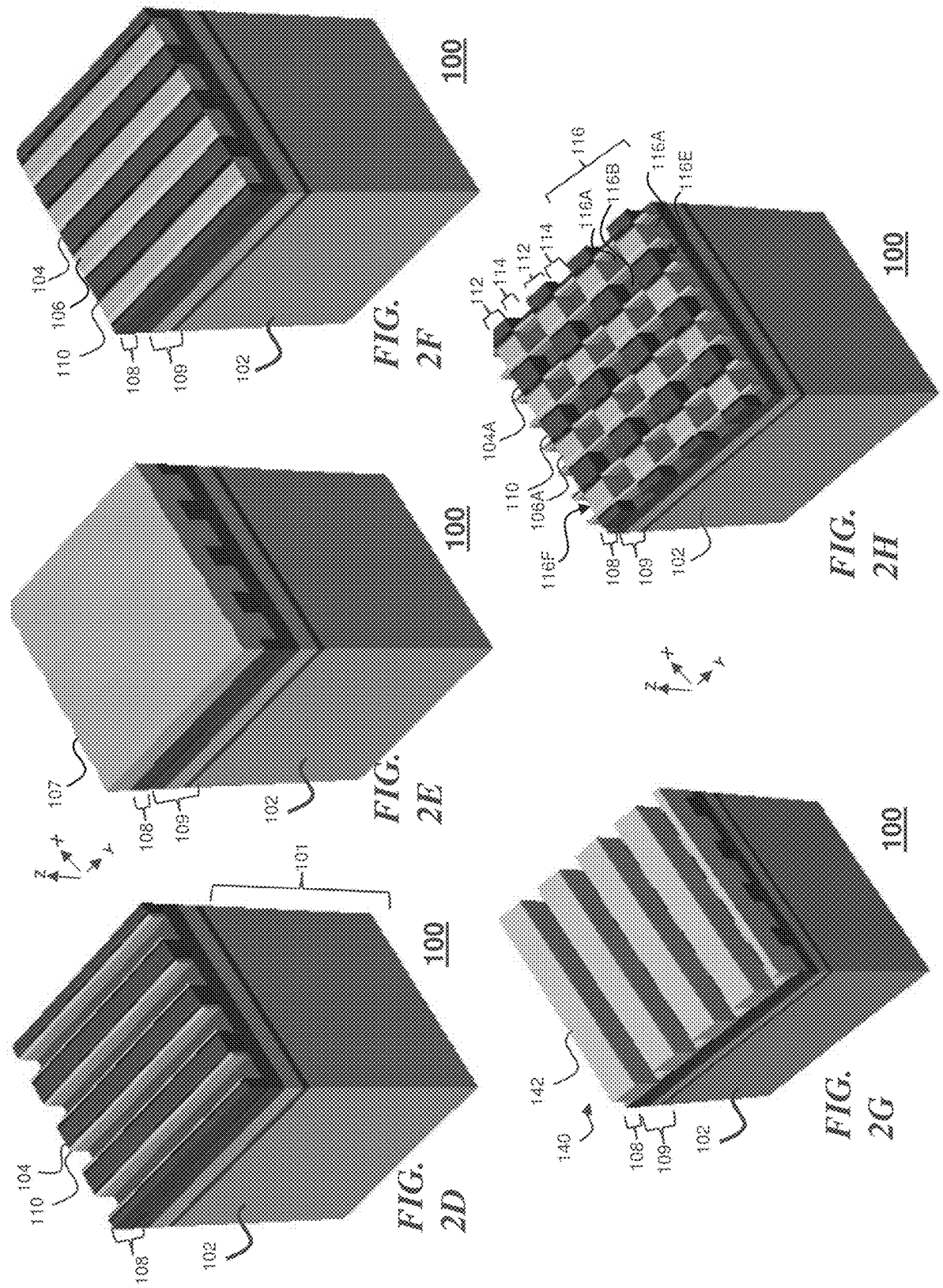

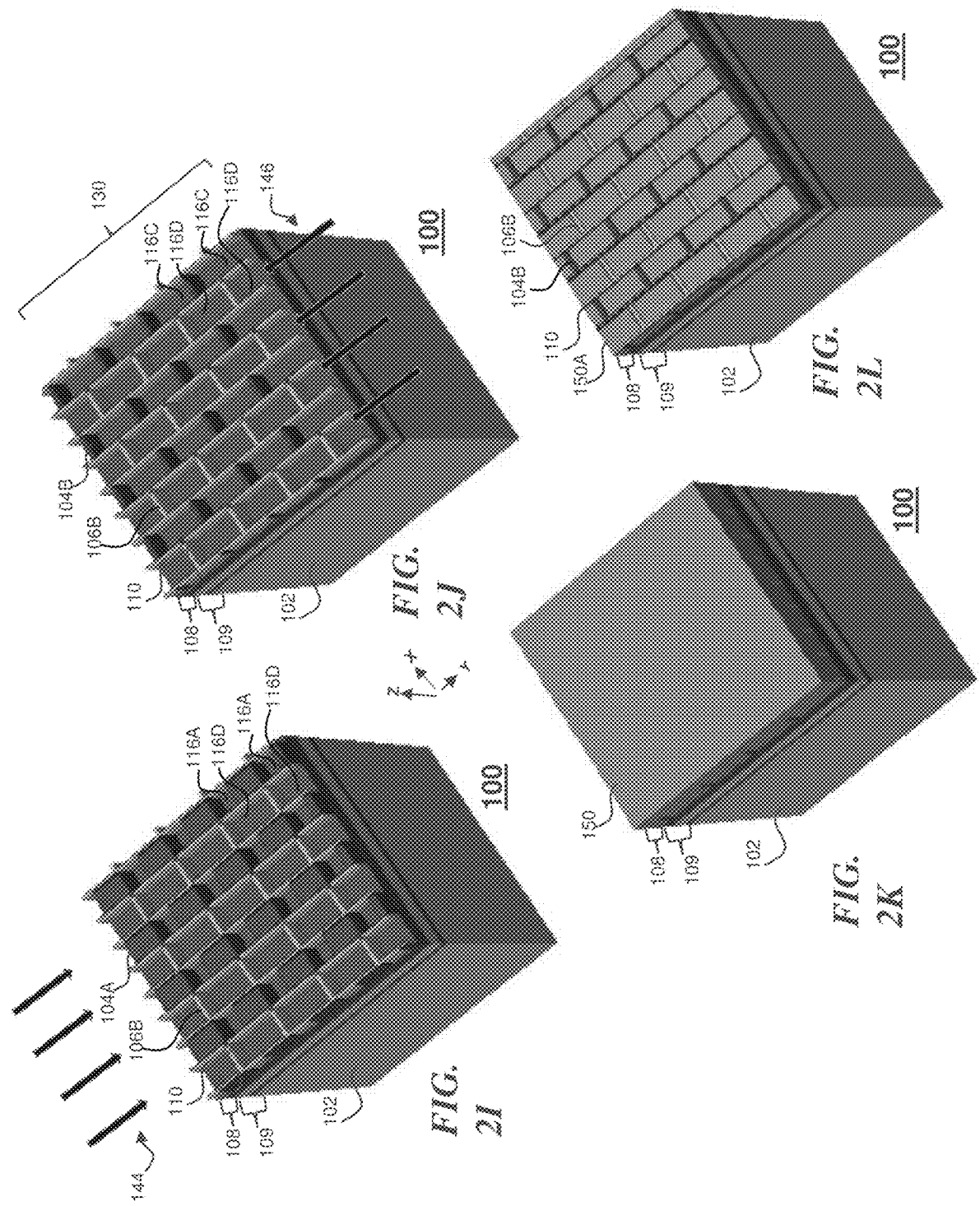

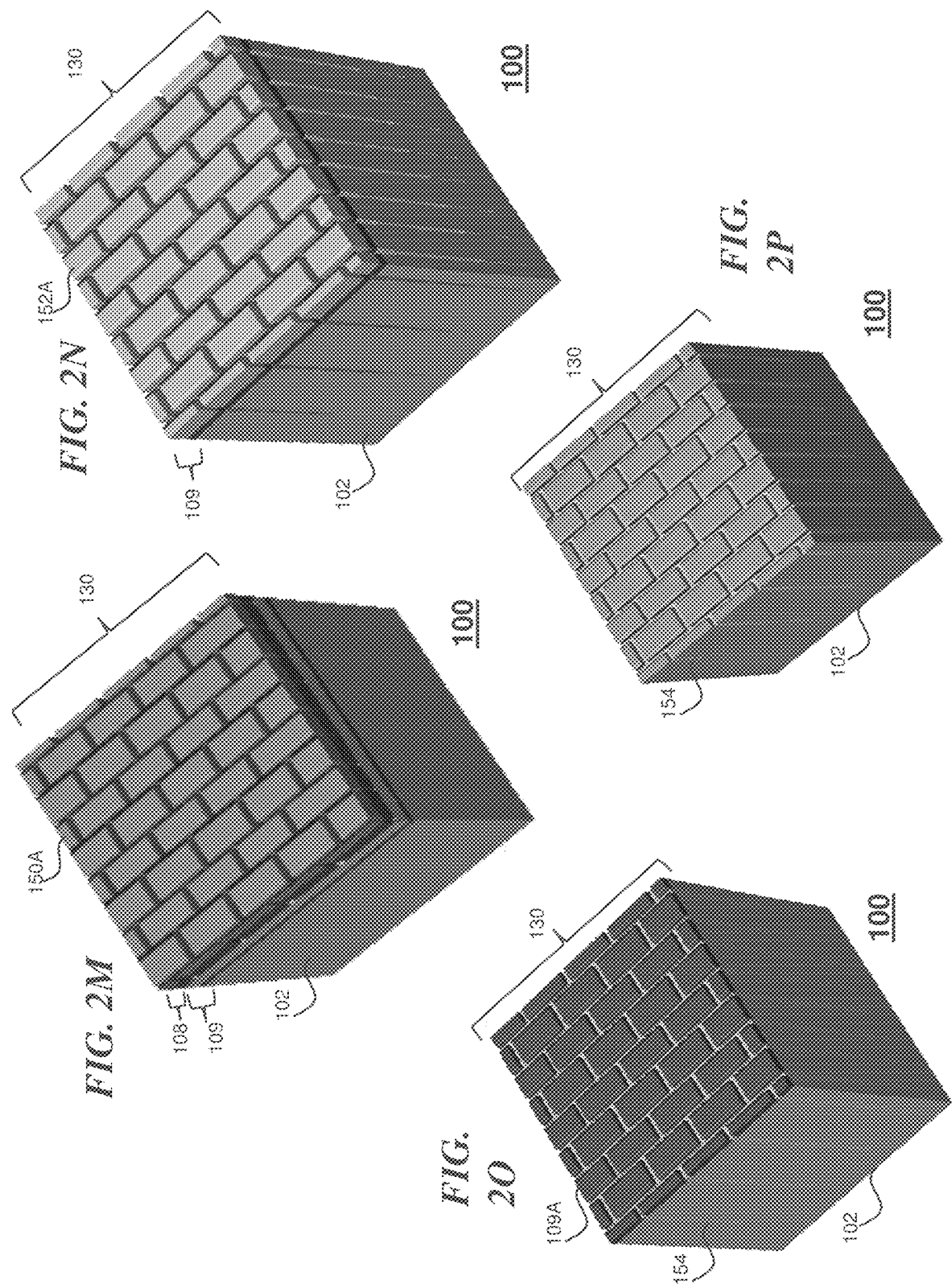

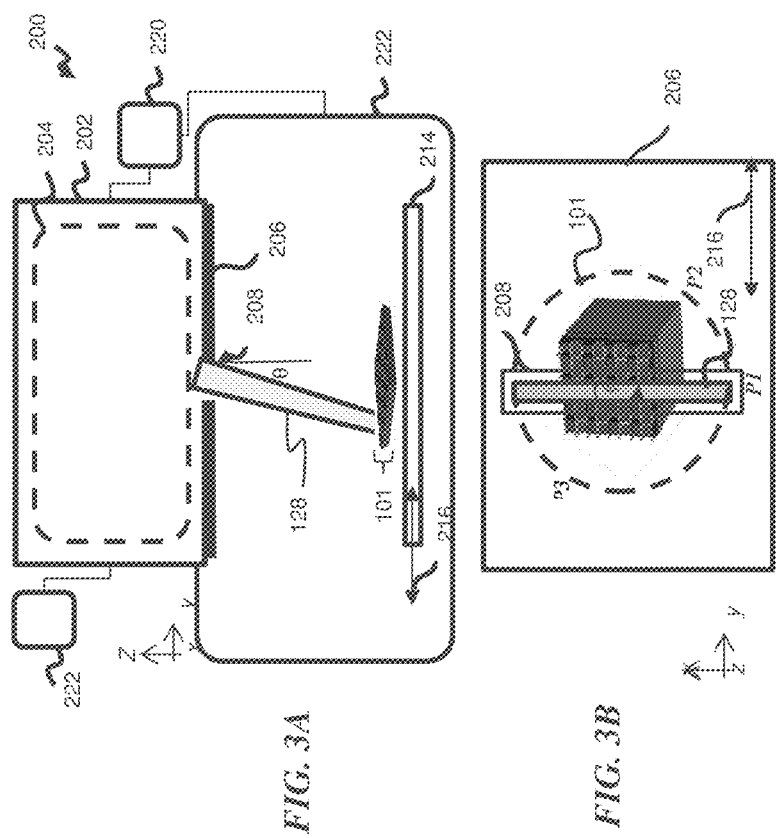

SPACER SCULPTING FOR FORMING SEMICONDUCTOR DEVICES

RELATED APPLICATIONS

This Application claims priority to U.S. provisional patent application No. 62/734,590, filed Sep. 21, 2018, entitled SPACER SCULPTING FOR FORMING SEMICONDUCTOR DEVICES, and incorporated by reference herein in its entirety.

FIELD

The present embodiments relate to semiconductor substrates, and more particularly, to processing semiconductor device structures.

BACKGROUND

As semiconductor devices shrink in size, including dynamic random-access memory (DRAM) devices, an increasing need exists to form structures including arrays of devices that are disposed in close proximity to one another. In many instances, lithographic imaging is not capable of generating features of a targeted dimension, as well as a targeted pitch for features arranged in an array. In some instances, multiple masks are used to generate device structures within a given "level" of a device, such as a DRAM array, due to the difficulty of imaging adjacent features in a mask. In present technology, a two-dimensional array of device structures is formed by patterning a series of linear structures using known lithography, such as deep ultraviolet lithography, as well as additional techniques, including self-aligned double patterning (SADP) or related techniques. These techniques may serve to reduce linewidth or pitch between lines, beyond the minimum linewidth resolvable by lithography alone.

The one-dimensional array of lines may subsequently be truncated using a chop mask or series of chop masks to form a two-dimensional array of features. The final structure may resemble a series of ovals, circles or other rounded features, aligned in a two-dimensional array. In addition, for features having a width, a length, and pitch on the order of 50 nm or less (pitch between features in an array may generally be on the order of twice the width of the feature), the process of truncating the lines to form chopped features may require multiple chop masks due to the close proximity of chop features. Because of the reduction in dimensions, misaligned chop mask or masks may result in defective structures, while overlay tolerance is decreasing with each reduction in array pitch. Moreover, the resulting array features may have non-ideal shapes after being processed by at least one chop mask operation.

With respect to these and other considerations, the present disclosure is provided.

BRIEF SUMMARY

In one embodiment, a method may include providing a substrate, including a patterning layer, forming a first pattern in the patterning layer, comprising a first array of a first material formed into first linear structures, interspersed with a second array of a second material, formed into second linear structures, the first linear structures and second linear structures being elongated along a first axis. The method may include generating a chop pattern in the first layer, comprising a third linear array, interspersed with a fourth linear array. The third and fourth linear arrays may be elongated along a second axis, forming a non-zero angle of incidence with respect to the first axis. The third linear array may include alternating portions of the first and second material, while the fourth linear array comprises an array of cavities, arranged within the patterning layer. The method may include elongating a first set of cavities of the array of cavities along the first axis, to form a first set of elongated cavities bounded by the first material.

In another embodiment, a device structure is provided. The device structure may include a first linear array, the first linear array comprising a first plurality of linear structures, extending along a first axis, and spaced from one another along a second axis. A given first linear structure of the first plurality of linear structures may include a first plurality of rectangular blocks, arranged in linear fashion along the first axis, wherein the first plurality of rectangular blocks are separated from one another by a first array of spacers. The device structure may include a second linear array, the second linear array comprising a second plurality of linear structures, extending along the first axis, spaced from one another along the second axis, and interspersed with the first linear array. A given second linear structure of the second plurality of linear structures may include a second plurality of rectangular blocks, arranged in linear fashion along the first axis, wherein the second plurality of rectangular blocks are separated from one another by a second array of spacers. The first plurality of linear structures may be separated from the second plurality of linear structures by a third array of spacers, wherein the first plurality of rectangular blocks is staggered with respect to the second plurality of rectangular blocks along the first axis.

In a further embodiment, a method of forming a dynamic random access memory array is provided. The method may include forming a patterning layer over a substrate base, the substrate base comprising monocrystalline semiconductor, and forming a first pattern in the patterning layer. The first pattern may include a first array of a first material, formed into first linear structures, interspersed with a second array of a second material, formed into second linear structures, the first linear structures and the second linear structures being elongated along a first axis. The method may include generating a chop pattern in the patterning layer, the chop pattern comprising a third array, comprising third linear structures, the third array extending along a second axis, the second axis forming a non-zero angle of inclination with respect to the first axis. The third linear structures may include alternating portions of the first material and the second material, and wherein an array of cavities is interspersed with the third linear structures, within the patterning layer. The method may further include elongating the array of cavities along the first axis, wherein a transfer pattern is formed, and transferring the transfer pattern into the substrate base.

BRIEF DESCRIPTION OF THE DRAWINGS

FIG. 1A to FIG. 1D depict exemplary operations involved in a method according to embodiments of the disclosure;

FIG. 2A to FIG. 2P show further exemplary operations involved in a method according to embodiments of the disclosure;

FIG. 3A and FIG. 3B show a side view and a top view, respectively, of a processing apparatus according to embodiments of the disclosure.

DETAILED DESCRIPTION

Figure 2Q:
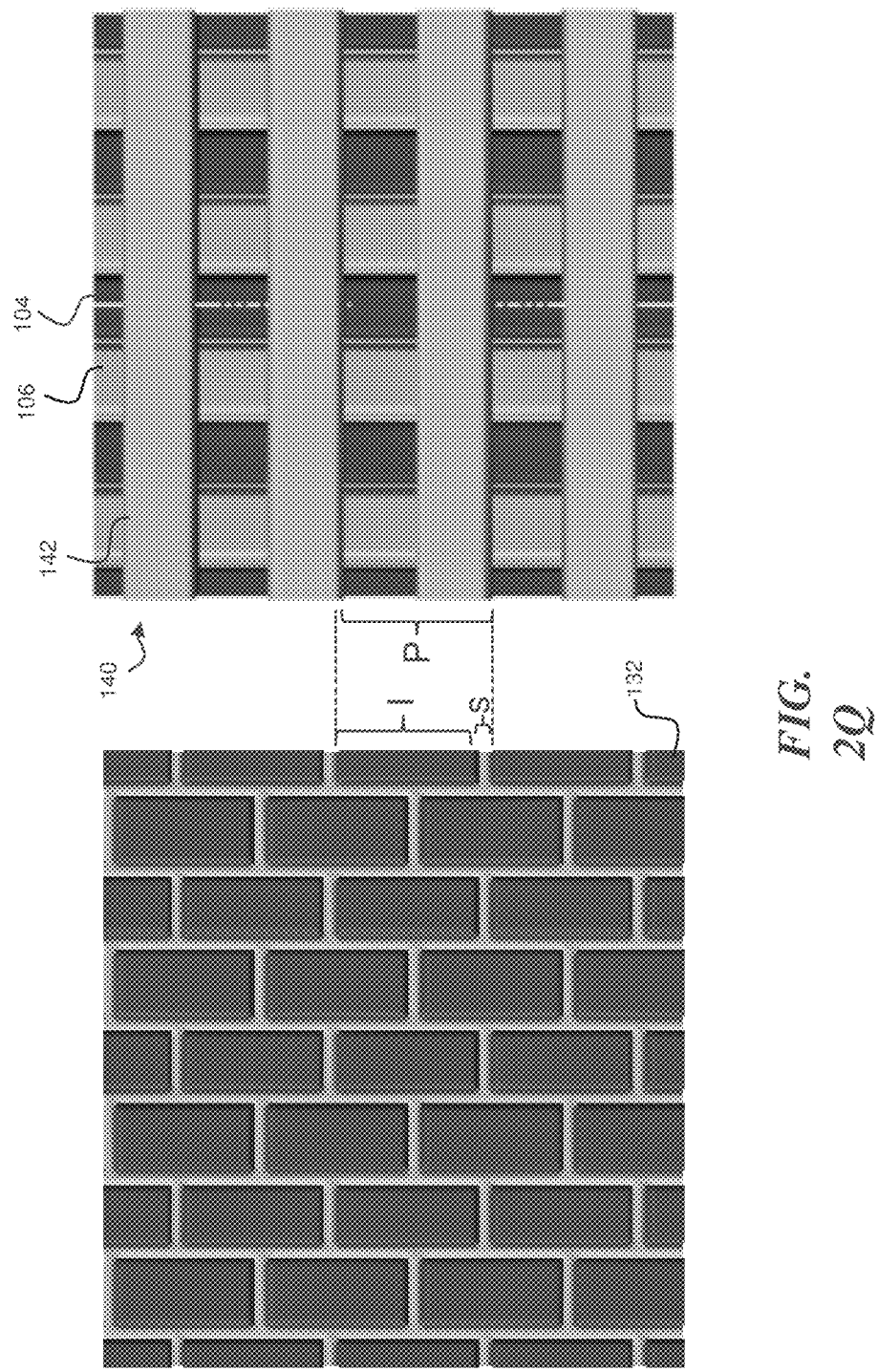
FIG. 2Q illustrates details of the geometry of arrays formed according to the present embodiments.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques and substrate structures to form devices, such as patterned arrays in memory devices, logic devices, or other semiconductor devices. These techniques may especially be applicable to formation of DRAM devices, while other devices may also be formed according to the embodiments of the disclosure. Various non-limiting embodiments are particularly useful for implementation where the width of structures, length of structures, or pitch between adjacent structures is less than 50 nm, and in some embodiments, 20 nm or less The present embodiments harness the ability to selectively elongate cavities within a substrate to define narrow features that define a transfer pattern for patterning features in closely-spaced arrays. According to some embodiments, novel device structures having rectangular features, such as rectangular blocks, spaced in arrays having pitches less than 100 mm, less than 50 nm, or less than 30 nm, are disclosed. The embodiments are not limited in this context.

FIG. 1A to FIG. 1D depict exemplary operations involved in a method according to embodiments of the disclosure. In FIG. 1A, a substrate 101 is provided, which substrate may include a substrate layer, shown as a substrate base 102, formed of a semiconductor material, such as a monocrystalline semiconductor, including silicon, silicon; germanium alloy, and the like. The substrate 101 may include other layers or structures not explicitly shown, as may be appreciated by those of skill in the art. In FIG. 1A, the substrate is provided with a patterning layer 108, discussed in more detail below, as well as a layer stack 109, subjacent the patterning layer. The substrate base 102 is disposed subjacent the layer stack 109. As shown in FIG. 1A, the patterning layer 108 is arranged in a first pattern 103, where the first pattern 103 includes a first array of first linear structures, shown as first linear structures 104, where the first linear structures 104 are formed of a first material, such as silicon oxide, silicon nitride, silicon, carbon, or other material. In the first pattern 103 the first linear structures 104 are interspersed with a second array formed from a second material, where the second material in formed into second linear structures, shown as second linear structures 106. The second linear structures 106 may be formed of a second material, such as silicon oxide, silicon nitride, silicon, carbon, or other material. Notably, in various embodiments, the first material differs from the second material. As shown in FIG. 1A, the first linear structures 104 and the second linear structures 106 are elongated along a first axis, represented by the Y-axis of the Cartesian coordinate system shown. In accordance with various embodiments of the disclosure, the first pattern 103 may be generated by a combination of deposition, lithography, and etch operations.

Turning now to FIG. 1B, in a subsequent instance, a chop pattern 105 is generated in the patterning layer 108. As detailed below, the chop pattern 105 may be generated by a combination of lithographic and etch operations. The chop pattern 105 may be characterized as a two-dimensional array. The chop pattern 105 may be characterized by a third array of third linear structures, shown as third linear structures 112, extending along a second axis, where the second axis forms a non-zero angle of inclination with respect to the first axis. In the example of FIG. 1B, the second axis may be defined by the X-axis, and may form a 90-degree angle of inclination with respect to the first axis. The embodiments are not limited in this context.

As shown in FIG. 1B, the third linear structures 112 include alternating portions of the first material and the second material of the first linear structures 104 and second linear structures 106, respectively. In addition to the third linear structures 112, the chop pattern 105 is characterized by an array of cavities, formed within the patterning layer 108. The array of cavities is shown as cavities 116, arranged in fourth linear structures 114, extending along the second axis, and interspersed with the third linear structures 112.

Turning to FIG. 1C, there is shown a subsequent instance where the operation of elongating the array of cavities along the first axis has been performed. Said differently, the cavities 116 of FIG. 1B have been elongated along the Y-axis to form first set of elongated cavities, shown as elongated cavities 116C, and elongated cavities 116D. As detailed below, a novel combination of angled reactive ion beam etch processes may be performed to generate the structure of FIG. 1C. As such, the elongated cavities of FIG. 1C define a transfer pattern 130, where the transfer pattern 130 may be used to form a similar pattern in at least one layer of the substrate 101, subjacent the patterning layer 108.

Turning to FIG. 1D, there is shown a subsequent instance, after the transfer pattern 130 is transferred into subjacent layers of the substrate 101. As detailed in the embodiments to follow, the transferring of the transfer pattern 130 may be accomplished using a combination of deposition, etch, and other operations. Notably, the general shape, and size, and details of the transfer pattern 130 of FIG. 1C may be preserved while implementing the transfer pattern 130 in layers subjacent to the patterning layer 108. Notably, the transfer pattern 130 may be implemented in a device array 132, as shown. The device array 132 may represent an array in a DRAM, an array in a logic device, or in another semiconductor device.

FIG. 2A to FIG. 2M show further exemplary operations involved in a method according to embodiments of the disclosure. The progression in this set of figures illustrates more details for implementing a device array according to various embodiments of the disclosure. In FIG. 2A there is shown the substrate 101 after deposition of the layer stack 109 on the substrate base 102, where the substrate base may be silicon. In this example, the individual layers of the layer stack 109 are not enumerated. In various embodiments, these layers may include a pad oxide, nitride chemical mechanical polish etch stop, an oxide mask layer, a nitride mask layer, and so forth. These layers may be used to assist in transferring a pattern such as the transfer pattern 130 into the substrate base 102, for example.

At FIG. 2B, the patterning layer 108 is deposited, and initially forms a blanket layer, over the layer stack 109. In one non-limiting embodiment, the patterning layer 108 in blanket form may be silicon, such as amorphous silicon or polysilicon. In subsequent processing operations, the patterning layer 108, may be patterned where different portions of the patterning layer may be formed of different material. Said differently, at least a portion of the material used to form the blanket form of patterning layer 108 may be removed and replaced with different material, as described below.

Turning to FIG. 2C, there is shown a subsequent instance where the patterning layer 108 has been patterned to form the first linear structures 104. In various embodiments, known lithography and etch processes may be performed to form the first linear structures 104. In various embodiments, the first linear structures 104 may have a width along the X-axis of less than 100 nm, less than 50 nm, for example.

In some embodiments, the first linear structures 104 may be formed by a combination of known lithography processes and known SADP processes. For example, the first linear structures 104 may be formed as remnants of sidewalls of larger linear structures that define the pitch of the first linear structures 104. As such, known lithography such as 193 nm excimer laser lithography, may be performed to image larger linear structures in an overlayer deposited over the patterning layer 108. A spacer layer may be formed over the larger linear structures, where the larger linear structures (e.g., 100 nm wide lines) to define sidewall spacers having a smaller dimension (e.g. 40 nm) along the Y-axis. The larger linear structures may be subsequently removed, leaving the first linear structures 104. This series of operations may be repeated with multiple masks to achieve a dense array of linear structures 104, such as a pitch where the pitch equals twice the linewidth.

Turning to FIG. 2D, there is shown a subsequent operation where sidewall spacers 110. Examples of suitable materials for sidewall spacers 110 include SiCN or SiBN, meaning mixtures of silicon, nitrogen, and carbon or boron. The embodiments are not limited in this context. Notably, the thickness of the layer to form sidewall spacers 110 may be designed to impart a target width of the sidewall spacers 110 along the direction perpendicular to the long direction of the linear structures, that is, along the X-axis. Thus, to form sidewall spacers 110 with a width of 10 nm along the X-axis, a layer of approximately 10 nm may be conformally deposited over the structure of FIG. 2C, followed by directional etching to remove the layer from horizontal surfaces (parallel to the X-Y plane).

Turning to FIG. 2E, there is shown a subsequent instance after blanket deposition of a planarizing layer 107, where the planarizing layer 107 may be silicon oxide in one embodiment, while in general is formed of a different material than the material of the first linear structures 104. Thus, in one example, the first linear structures 104 may be formed of amorphous silicon, while the planarizing layer 107 is silicon oxide (SiO2). As such, the planarizing layer 107 may fill the regions between the first linear structures 104, leading to the structure as shown. The overburden of the first planarizing layer may be sufficient to facilitate a known polishing or planarizing process, such as chemical mechanical polishing (CMP). In FIG. 2F, the structure of the substrate 101 is shown after a planarization process is performed, generating the first linear structures 104, interspersed with the second linear structures 106. Notably, sidewall spacers 110 are also interspersed between the first linear structures 104 and the second linear structures 106.

Turning to FIG. 2G, a subsequent instance is shown where a chop mask 140 is formed over the structure of FIG. 2F. The chop mask 140 may be formed by depositing a blanket layer of a suitable material such as a photoresist, a nitride hard mask, a carbon layer, or other suitable material. The blanket layer may be patterned to form linear mask features 142, extending along an axis forming a non-zero angle of inclination with respect to the axis of the first linear structures 104 and second linear structures 106. This angle may be ninety degrees, for example. As such the linear mask features 142 may be used to define linear features in the patterning layer 108, extending along the X-axis.

In some embodiments, the chop mask 140 may be designed as an equal line and space pattern. The chop mask 140 may be used define the dimensions of features to be formed in subjacent regions of the substrate 101. For example, as shown in FIG. 2Q, according to some embodiments where device structures are to be formed in arrays isolated by STI insulator, the pitch P of the chop mask may equal the distance defined by the STI island length I of features formed in the substrate 101, plus the tip-to-tip distance S of adjacent features. Said differently, in the case of a mask having equal lines and spaces, the linewidth of the lines of linear mask features 142 is equivalent to the STI island length of features divided by two, minus the tip-to-tip distance of adjacent features.

Turning now to FIG. 2H, there is shown a subsequent instance after the substrate 101 is etched with the chop mask 140 in place. The etching may be performed using known etch techniques, such as reactive ion etching, where material in the patterning layer 108 is removed in exposed linear regions between the linear mask features 142. Subsequently the chop mask 140 may be removed, leaving the structure of FIG. 2H. At this stage, the third linear structures 112 have been formed where the first linear structures 104 and the second linear structures 106 are now chopped into discrete portions. Thus, a given linear structure of the third linear structures 112 includes alternating portions of a first material of the first linear structures 104, shown as regions 104A, and portions of a second material of the second linear structures 106, shown as regions 106A. In addition, in regions that were not covered by the chop mask 140, an array of cavities, shown as the cavities 116, is formed between third linear structures 112, as previously discussed. Notably, the etch process used to etch the patterning layer 108 to form the cavities 116 may be selective to the sidewall spacers 110, meaning the material of first linear structures 104, such as silicon, and of second linear structures 106, such as oxide, is etched preferentially with respect to the material of sidewall spacers 110, such as SiCN. Thus, the cavities 116 are bounded by sidewall spacers 110, extending along the Y-axis, and either by regions 104A, yielding a first set of cavities, the cavities 116A, or by regions 106A, yielding a second set of cavities, the cavities 116B.

Turning to FIG. 2I there is shown a subsequent instance after the cavities 116B have been directionally etched using angled ion beam 144 to form elongated cavities 116D, elongated along the Y-axis. The elongated cavities 116D are now bounded by spacers 106B, where the spacers 106B are sculpted by selectively removing material from the regions 106A, to generate narrow spacers of the second material of second linear structures 106.

Turning now to FIG. 2J, there is shown a subsequent instance after the first set of cavities (cavities 116A) has been directionally etched using angled ion beam 146 to form elongated cavities 116C, also elongated along the Y-axis. The elongated cavities 116C are bounded by spacers 104B, where the spacers 104B are sculpted by selectively removing material from the regions 104A, to generate narrow spacers of the first material of the first linear structures 104. The elongated cavities 116C and elongated cavities 116D are thus bounded by arrays of spacers (spacers 104B and spacers 106B).

According to various embodiments, the formation of the elongated cavities 116C and the elongated cavities 116D may be formed using a reactive angled ion beam etch. As an example, the elongated cavities 116C may be formed using a reactive angled ion beam etch that etches amorphous silicon with respect to SiCN, leaving the sidewall spacers 110 intact. The reactive angled ion beam etch may also be selective to an immediately subjacent layer of the layer stack 109, such as silicon nitride, so as not to etch the layer stack 109.

Likewise, the elongated cavities 116D may be formed using a reactive angled ion beam etch that etches silicon oxide with respect to SiCN, leaving the sidewall spacers 110 intact. The reactive angled ion beam etch may also be selective to an immediately subjacent layer of the layer stack 109, such as silicon nitride, so as not to etch the layer stack 109.

According to various embodiments the operations in FIGS. 2I and 2J may be performed in the order shown or in a reverse order where the operation of FIG. 2J takes place first. As such, the transfer pattern 130 may be formed as shown in FIG. 2J. By arranging the etches of FIGS. 2I and 2J to remove a predetermined amount of material of the region 104A and the region 106A, spacers 104B and spacers 106B may be formed to a designed spacer width, such as 20 nm, 15 nm, 10 nm, 5 nm, or 3 nm. The embodiments are not limited in this context. Thus, the transfer pattern 130, as embodied in patterning layer 108, may constitute a skeleton of spacers arranged in a two-dimensional matrix, such as a rectangular matrix in some embodiments. Because the transfer pattern 130 is formed by merely overlaying a single chop mask (chop mask 140) on an existing pattern of lines, overlay issues are avoided when multiple masks are used. In addition, all the cavities of transfer pattern 130 within patterning layer 108 are self-aligned with one another.

In a subsequent series of operations, shown in FIG. 2K to FIG. 2P, the transfer pattern 130 may be formed within subjacent regions of the substrate 101, to form a device array, for example. In some embodiments, a tone reversal of the transfer pattern may be performed, illustrated in particular in FIGS. 2K-2M. In FIG. 2K a fill layer 150 is deposited, such as spin on carbon. In FIG. 2L, the fill layer 150 is planarized, leaving fill islands 150A. In FIG. 2M material of the spacers 104B, spacers 106B and sidewall spacers 110 is selectively removed with respect to the material of fill layer 150, leaving a reverse tone pattern version of the transfer pattern 130. The reverse tone pattern thus is characterized by an array of rectangular features (see fill islands 150A), defined the selectively removed spacers.

At FIG. 2N the transfer pattern 130 is transferred into a subjacent layer, such as oxide, defining the structures 152A. At FIG. 2O, the transfer pattern 130 has been transferred to a further subjacent layer, such as a nitride layer, forming islands 109A, as well as into the substrate base 102, forming trench pattern in the substrate base 102 arranged in the shape of the transfer pattern 130. The trenches may subsequently be filled with an oxide, forming filled trenches 154. At FIG. 2P the same structure as in FIG. 2O is shown, except with the nitride layer removed. In this stage, a two-dimensional array of devices has been formed within the substrate base 102, defined by the transfer pattern 130.

Turning now to FIG. 3A, there is shown a processing apparatus 200, depicted in schematic form. The processing apparatus 200 represents a processing apparatus for selectively elongating cavities in a substrate, such as described in the operations of FIG. 2I and FIG. 2J. The processing apparatus 200 may be a plasma-based processing system having a plasma chamber 202 for generating a plasma 204 therein by any convenient method as known in the art. An extraction plate 206 may be provided as shown, having an extraction aperture 208, where a selective etching may be performed to selectively remove sidewall layers. A substrate 101, such as a substrate 101 having the aforementioned structure as shown at FIG. 2I, is disposed in the process chamber 222. A substrate plane of the substrate 101 is represented by the X-Y plane of the Cartesian coordinate system shown, while a perpendicular to the plane of the substrate 101 lies along the Z-axis (Z-direction).

During a directional etching operation, the angled ion beam 128 is extracted through the extraction aperture 208 as shown. The angled ion beam 128 may be extracted when a voltage difference is applied using bias supply 220 between the plasma chamber 202 and substrate 101 as in known systems. The bias supply 220 may be coupled to the process chamber 222, for example, where the process chamber 222 and substrate 101 are held at the same potential. In various embodiments, the angled ion beam 128 may be extracted as a continuous beam or as a pulsed ion beam as in known systems. For example, the bias supply 220 may be configured to supply a voltage difference between plasma chamber 202 and process chamber 222, as a pulsed DC voltage, where the voltage, pulse frequency, and duty cycle of the pulsed voltage may be independently adjusted from one another.

By scanning a substrate stage 214 including substrate 101 with respect to the extraction aperture 208, and thus with respect to the angled ion beam 128, along the scan direction 216, the angled ion beam 128 may etch targeted surfaces of structures, such as the cavities 116A and cavities 116B, when such structures are oriented, for example, perpendicularly to the scan direction 216, as further shown in FIG. 3B. In various embodiments, for example, the angled ion beam 128 may be provided as a ribbon ion beam having a long axis that extends along the X-direction of the Cartesian coordinate system shown in FIG. 2B. The substrate 101 may be arranged, for example, where one set of sidewalls of the cavities 116A is exposed to the angled ion beam 128. For example, the cavities 116A may be oriented with the long direction of the first linear structures 104 and second linear structures 106 (Y-axis) is perpendicular to the long axis of the extraction aperture, along the X-axis. In this manner, as shown in FIG. 3A, the angled ion beam 128, forming a non-zero angle of incidence with respect to the Z-axis (normal to the substrate plane), may strike the sidewalls oriented along the X-Z plane, as noted. This geometry facilitates reactive ion etching of the X-Z sidewalls, while not etching the Y-Z sidewalls, and thus selectively elongates the cavities 116A to generate the elongated structure of the elongated cavities 116C, as shown in FIG. 2J. In various embodiments, the value of the non-zero angle of incidence may vary from 5 degrees to 85 degrees, while in some embodiments the value may range between 30 degrees and 60 degrees. The embodiments are not limited in this context. The angled ion beam 128 may be composed of any convenient gas mixture, including inert gas, reactive gas, and may be provided in conjunction with other gaseous species in some embodiments. In particular embodiments, the angled ion beam 128 and other reactive species may be provided as an etch recipe to the substrate 101 so as to perform a directed reactive ion etching of targeted sidewalls of patterning layers on substrate 101. The etch recipe may be selective with respect to the material of the subjacent layers of layer stack 109, so as to remove select material of the patterning layer 108, while not etching the layer stack 109, or etching the layer stack 109 to a lesser extent.

In this example of FIG. 3B, the substrate 101 is a circular wafer, such as a silicon wafer, the extraction aperture 208 is an elongated aperture, having an elongated shape. The angled ion beam 128 is provided as a ribbon ion beam extending to a beam width along the X-direction, where the beam width is adequate to expose an entire width of the substrate 100, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

As also indicated in FIG. 3B, the substrate 101 may be scanned in the scan direction 216, where the scan direction 216 lies in the X-Y plane, such as along the Y-direction. Notably, the scan direction 216 may represent the scanning of substrate 101 in two opposing (180 degrees) directions along the Y-direction, or just a scan toward the left or a scan toward the right. As shown in FIG. 3B, the long axis of angled ion beam 128 extends along the X-direction, perpendicularly to the scan direction 216. Accordingly, an entirety of the substrate 101 may be exposed to the angled ion beam 128 when scanning of the substrate 101 takes place along a scan direction 216 to an adequate length from a left side to right side of substrate 101 as shown in FIG. 3B.

As also shown in FIG. 3B, the exposure of substrate 100 to the angled ion beam 128 may take place when the substrate 101 is scanned while disposed at a first rotational position as indicated by the position P1 on substrate 101 being located under the location L on the extraction plate 206. For example, the position P1 may correspond to the position of a notch or a flat on a wafer. In accordance with various embodiments, a plurality of scans may be performed to selectively remove sidewall spacers from different sidewalls, where the substrate 101 may be rotated through a plurality of different rotational positions, as noted. For example, as shown in FIG. 2J, the transfer pattern 130 represents a pattern where adjacent cavities are staggered from one another as viewed along the X-axis, generating the staggered device array of FIG. 2P. To generate this staggered pattern, the operation of FIG. 2I may take place when the substrate 101 is at a twist angle φ of 0 degrees, represented by P1, while the operation of FIG. 2J takes place when the substrate 101 is ate at a twist angle φ of 180 degrees, represented by the position P2. In this manner a first reactive angled ion beam etches a first set of cavities (cavities 116A) along a first direction, parallel to the Y axis, while a second reactive angled ion beam etches the second set of cavities (cavities 116B) along a second direction, opposite the first direction. Referring also just the upper sidewalls 116E of cavities 116A to be etched, while just the lower sidewalls 116F of the cavities 116B are etched, ensuring the staggered configuration of cavities shown in FIG. 2J.

Figure 4:
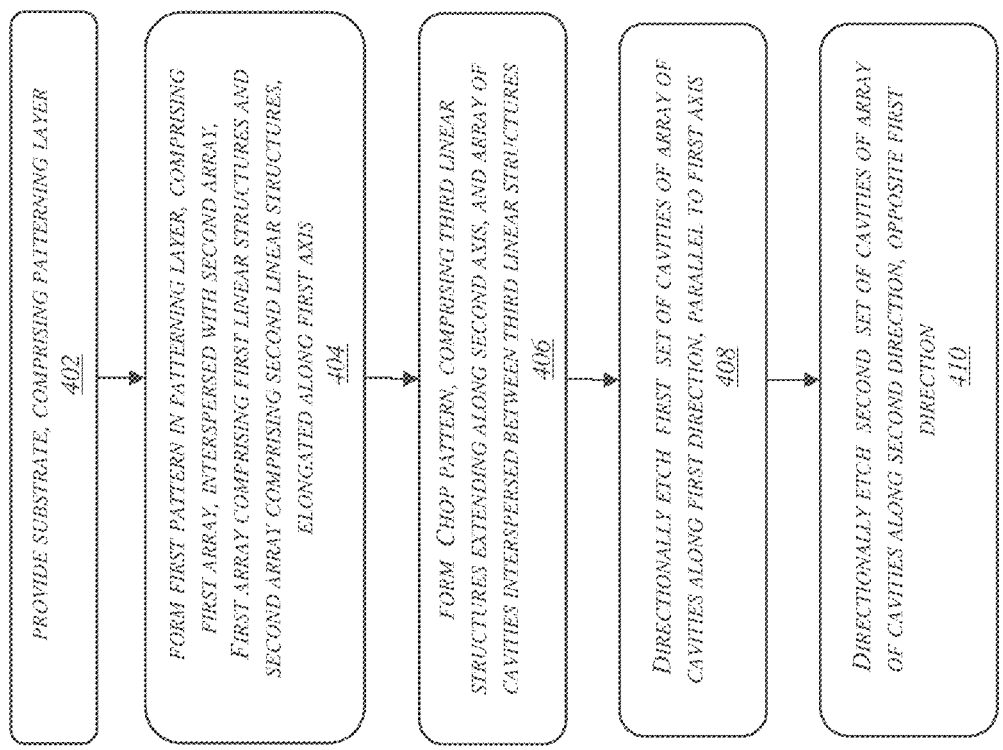
FIG. 4 presents an exemplary process flow according to an embodiment of the disclosure.

FIG. 4 depicts an exemplary process flow 400, according to embodiments of the disclosure. At block 402, a substrate is provided. The substrate may include a substrate base and a layer stack, disposed on the substrate base. In various embodiments, the substrate base may be a monocrystalline semiconductor material, while the layer stack includes different layers, such as oxide, nitride, carbon, carbide, and so forth. A patterning layer may be formed on top of the layer stack.

At block 404, a first pattern is formed in the patterning layer. The first pattern is formed from a first array of first linear structure, interspersed with a second array of second linear structures, where the first linear structures and second linear structures are elongated along a first axis.

At block 406, a chop pattern is formed in the patterning layer. The chop pattern may be formed of third linear structures, elongated along a second axis, forming a non-zero angle with respect to the first axis. The chop pattern may have an array of cavities interspersed with the third linear structures.

At block 408, a first set of cavities of the array of cavities is directionally etched along a first direction, parallel to the first axis.

At block 410, first set of cavities of the array of cavities is directionally etched along a second direction, parallel to the first axis, and opposite the first direction.

The present embodiments provide various advantages over known processing to form devices such as arrays of semiconductor structures for forming DRAM transistors. For one advantage, device structures, such as active arrays, may be formed where DRAM tip node to tip requirements are met using novel selective elongation of cavities forming an etch pattern, using just self-aligned processes. For another advantage, another advantage, overlay challenges are reduced significantly by eliminating mask alignment operations.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   providing a substrate, the substrate comprising a patterning layer;
   forming a first pattern in the patterning layer, the first pattern comprising a first array of a first material, formed into first linear structures, interspersed with a second array of a second material, formed into second linear structures, the first linear structures and the second linear structures being elongated along a first axis;
   generating a chop pattern in the patterning layer, the chop pattern comprising a third array of third linear structures, elongated along a second axis, the second axis forming a non-zero angle of inclination with respect to the first axis,
   wherein the third linear structures comprise alternating portions of the first material and the second material, wherein an array of cavities is interspersed with the third linear structures, within the patterning layer; and
   elongating a first set of cavities of the array of cavities along the first axis, to form a first set of elongated cavities, bounded by the first material.

2. The method of claim 1, wherein the elongating the first set of cavities comprises directionally etching the first set of cavities using a reactive angled ion beam etch.

3. The method of claim 1, further comprising elongating a second set of cavities of the array of cavities along the first axis, to form a second set of elongated cavities, bounded by the second material.

4. The method of claim 3, wherein after the elongating the first set of cavities and the elongating the second set of cavities, the first set of elongated cavities and the second set of elongated cavities are staggered from one another.

5. The method of claim 3, wherein the elongating the first set of cavities comprises directionally etching the first set of cavities using a first reactive angled ion beam etch, and wherein the elongating the second set of cavities comprises directionally etching the second set of cavities using a second reactive angled ion beam etch.

6. The method of claim 5, wherein the first reactive angled ion beam etch etches the first set of cavities along a first direction, parallel to the first axis, and wherein the second reactive angled ion beam etch etches the second set of cavities along a second direction, parallel to the first axis, and opposite the first direction.

7. The method of claim 3, wherein after the elongating the first set of cavities and the elongating the second set of cavities, the first set of elongated cavities define a first set of spacers, elongated along the second axis, and the second set of elongated cavities define a second set of spacers, elongated along the second axis.

8. The method of claim 7, wherein the first pattern further comprises a third set of spacers, the third set of spacers being elongated along the first axis, wherein the first set of spacers, second set of spacers, and third set of spacers define a transfer pattern.

9. The method of claim 8, further comprising transferring the transfer pattern into a substrate layer, disposed subjacent the patterning layer.

10. The method of claim 9, wherein the transferring the transfer pattern into the substrate layer comprises performing a tone reversal of the transfer pattern.

* * * * *